US008803407B2

(12) United States Patent
Kawase et al.

(10) Patent No.: US 8,803,407 B2
(45) Date of Patent: Aug. 12, 2014

(54) PIEZOELECTRIC DEVICE WITH ASYMMETRICALLY MOUNTED TUNING-FORK TYPE PIEZOELECTRIC VIBRATING PIECE

(75) Inventors: Yuichi Kawase, Sayama (JP); Toshiaki Motegi, Sayama (JP); Shingo Kawanishi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 635 days.

(21) Appl. No.: 13/093,089

(22) Filed: Apr. 25, 2011

(65) Prior Publication Data

US 2011/0260586 A1 Oct. 27, 2011

(30) Foreign Application Priority Data

Apr. 26, 2010 (JP) ................................ 2010-100465

(51) Int. Cl.
*H01L 41/04* (2006.01)
*H03H 9/21* (2006.01)
*H03H 9/10* (2006.01)

(52) U.S. Cl.
CPC ............... *H03H 9/1021* (2013.01); *H03H 9/21* (2013.01)
USPC .......................................... 310/370; 310/344

(58) Field of Classification Search
CPC ..... H03H 9/21; H03H 9/0519; H03H 9/0595; H03H 9/1021; H01L 41/053
USPC ................................................. 310/344, 370
See application file for complete search history.

(56) References Cited

U.S. PATENT DOCUMENTS

| | | | | |
|---|---|---|---|---|
| 7,015,631 | B2 * | 3/2006 | Hirasawa et al. | 310/370 |
| 7,579,748 | B2 * | 8/2009 | Kuroda | 310/312 |
| 7,592,741 | B2 | 9/2009 | Tanaya et al. | |
| 8,456,065 | B2 * | 6/2013 | Amano et al. | 310/344 |
| 2008/0211350 | A1 * | 9/2008 | Tanaya et al. | 310/328 |

FOREIGN PATENT DOCUMENTS

| | | |
|---|---|---|
| JP | 2004-297198 | 10/2004 |
| JP | 2006-203458 | 8/2006 |
| JP | 2007-081570 | 3/2007 |
| JP | 2009-021794 | 1/2009 |

* cited by examiner

*Primary Examiner* — Jaydi San Martin
(74) *Attorney, Agent, or Firm* — Alix, Yale & Ristas, LLP

(57) ABSTRACT

The piezoelectric device comprises a piezoelectric vibrating piece having a base portion, a pair of vibrating arms extending in a specified direction from the base portion, and a pair of connection portions disposed on the pair of the supporting arms; a package having a bottom surface which accommodates the piezoelectric vibrating piece and side faces surrounding the bottom surface, in which a pair of electrode pads corresponding to the connection portions are formed on the bottom surface; and adhesive for bonding the pair of the electrode pads with the pair of connection portions. One electrode pad and the other electrode pad, with adhesive applied to the electrode pads, are shifted with respect to each other in a predetermined direction.

20 Claims, 8 Drawing Sheets

100

PKG
28
21
29
22
O2(35)
O'
P2(35)
P'
Q2(35)
Q'
32
23
G
31
Q
Q1(35)
P
P1(35)
O
O1(35)
Q1
55
P1
P2
Q2
W1
X
Y
Z

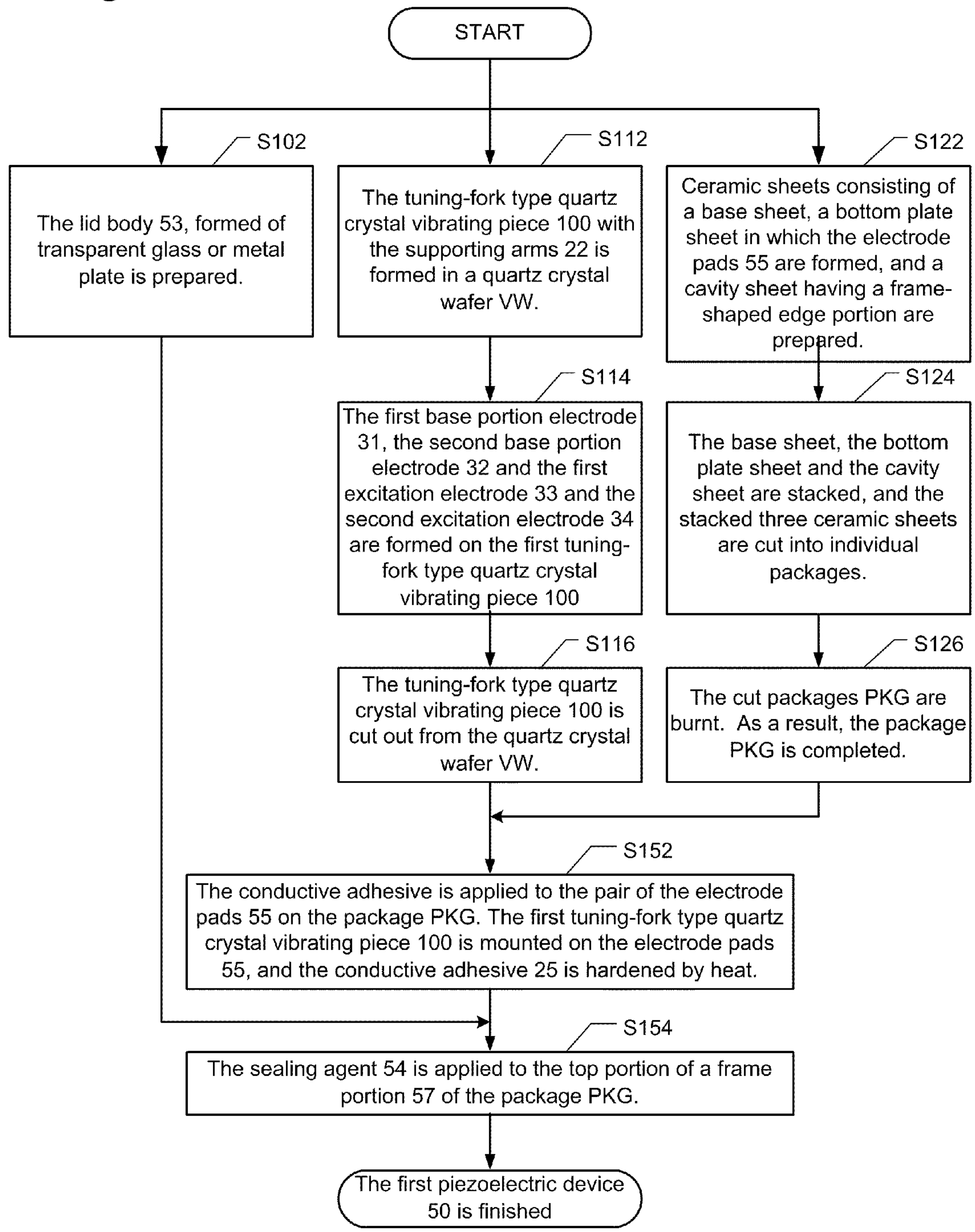
Fig. 4
START
S102
The lid body 53, formed of transparent glass or metal plate is prepared.
S112
The tuning-fork type quartz crystal vibrating piece 100 with the supporting arms 22 is formed in a quartz crystal wafer VW.
S122
Ceramic sheets consisting of a base sheet, a bottom plate sheet in which the electrode pads 55 are formed, and a cavity sheet having a frame-shaped edge portion are prepared.
S114
The first base portion electrode 31, the second base portion electrode 32 and the first excitation electrode 33 and the second excitation electrode 34 are formed on the first tuning-fork type quartz crystal vibrating piece 100
S124
The base sheet, the bottom plate sheet and the cavity sheet are stacked, and the stacked three ceramic sheets are cut into individual packages.
S116
The tuning-fork type quartz crystal vibrating piece 100 is cut out from the quartz crystal wafer VW.
S126
The cut packages PKG are burnt. As a result, the package PKG is completed.
S152
The conductive adhesive is applied to the pair of the electrode pads 55 on the package PKG. The first tuning-fork type quartz crystal vibrating piece 100 is mounted on the electrode pads 55, and the conductive adhesive 25 is hardened by heat.
S154
The sealing agent 54 is applied to the top portion of a frame portion 57 of the package PKG.
The first piezoelectric device 50 is finished

PIEZOELECTRIC DEVICE WITH ASYMMETRICALLY MOUNTED TUNING-FORK TYPE PIEZOELECTRIC VIBRATING PIECE

CROSS-REFERENCE TO RELATED APPLICATION

This application claims priority to and the benefit of Japan Patent Application No. 2010-100465 filed on Apr. 26, 2010 in the Japan Patent Office, the disclosure of which is incorporated herein by reference in its entirety.

FIELD

The present invention relates to a piezoelectric device with a tuning-fork type piezoelectric vibrating piece which has a pair of vibrating arms and a pair of supporting arms provided on both outsides of those vibrating arms.

DESCRIPTION OF THE RELATED ART

Accompanied by miniaturization of the tuning-fork piezoelectric piece, there occurs a phenomenon of vibration leakage which is generated when mechanical vibration energy generated in the vibrating arms leaks outward directly through its base portion. The vibration leakage induces a drop in vibration efficiency of the vibrating arms thereby resulting in deterioration of equivalent series resistance and deviation of vibration frequency. Thus, to reduce influences of the vibration leakage, there has been proposed a technology in which a pair of supporting arms are extended from the base portion on both outsides of the vibrating arms so as to support a tuning-fork type piezoelectric vibrating piece with the supporting arms. A connection portion disposed on this supporting arm is bonded to an electrode pad formed on the bottom surface of a package with conductive adhesive. In case where the tuning-fork type piezoelectric vibrating piece is supported by the supporting arms, the vibrating arms swing significantly with respect to an impact caused by, for example, a fall. Then, according to U.S. Pat. No. 7,592,741, the bottom surface of the package is provided with a recess portion, which prevents a distal end of the vibrating arm from colliding with the bottom surface of the package.

However, the electrode pads are disposed symmetrically with respect to a center line of the tuning-fork type piezoelectric vibrating piece and accompanied by a miniaturization of the tuning-fork piezoelectric vibrating piece, a spacing between the electrode pads decreases so that conductive adhesive applied to the electrode pads flows away thereby possibly resulting in a short-circuit. Decreasing the amount of adhesive in order to prevent the short-circuit weakens adhesive force to result in deterioration of resistance to impact of the tuning-fork type piezoelectric vibrating piece.

The gravity center of the tuning-fork piezoelectric vibrating piece is located on the base portion side with respect to the center in an extension direction of the vibrating arm of the tuning-fork type piezoelectric vibrating piece. Thus, when the tuning-fork type piezoelectric vibrating piece is bonded to the electrode pad in the package, the base portion side of the tuning-fork type piezoelectric vibrating piece is inclined toward the bottom surface while applied conductive adhesive is hardened, so that an end of the base portion of the tuning-fork type piezoelectric vibrating piece makes contact with the bottom surface. Alternatively, a clearance between the end of the base portion and the bottom surface may become smaller.

When an impact is applied to a piezoelectric device in whose package the tuning-fork type piezoelectric vibrating piece is accommodated, preferably, a distal end of the tuning-fork piezoelectric vibrating piece or the end of the base portion makes contact with the bottom surface of the package or a ceiling of a lid body.

An object of the present invention is to provide a piezoelectric device in which electrode pads for joining the turning-fork type piezoelectric vibrating piece with the package are located asymmetrically with each other with respect to the center line of the turning-fork type piezoelectric vibrating piece so as to prevent conductive adhesive applied to the electrode pad from causing a short-circuit even if the conductive adhesive flows away. Another object of the present invention is to provide a piezoelectric device in which the tuning-fork type piezoelectric vibrating piece is mounted horizontally when it is fixed with adhesive and which is highly resistant to vibration when the adhesive is hardened.

SUMMARY

It is an object of the present invention to provide a quartz crystal device. A first aspect of a piezoelectric device comprises a piezoelectric vibrating piece having a base portion, a pair of vibrating arms extending in a specified direction from the base portion, and a pair of connection portions disposed on the pair of the supporting arms; a package having a bottom surface which accommodates the piezoelectric vibrating piece and side faces surrounding the bottom surface, in which a pair of electrode pads corresponding to the connection portions are formed on the bottom surface; and adhesive for bonding the pair of the electrode pads with the pair of connection portions. And one electrode pad and the other electrode pad, with adhesive applied to the electrode pads, are shifted with respect to each other in a predetermined direction.

In a second aspect of the piezoelectric device, the pair of the electrode pads are formed in the form of a pedestal having a width in the predetermined direction and one electrode pad and the other electrode pad, with adhesive applied to the electrode pads, are located such that the electrode pads do not overlap each other when viewed from the horizontal direction perpendicular to the predetermined direction.

In a third aspect of the piezoelectric device, the connection portions are disposed on a straight line passing a gravity center of the piezoelectric vibrating piece.

In a fourth aspect of the piezoelectric device, the connection portion is disposed at any point of the length of the supporting arm in the predetermined direction.

In a fifth aspect of the piezoelectric device, the pair of the electrode pads serve as positioning marks for locating the piezoelectric vibrating piece within the package and by detecting the positioning marks, the piezoelectric vibrating piece is mounted within the package.

In a sixth aspect of the piezoelectric device, a first recess portion is formed in the bottom surface corresponding to a distal end of the vibrating arm in the predetermined direction such that it is recessed from the bottom surface, and a second recess portion is formed in the bottom surface corresponding to the base portion located on an opposite side to the distal end of the vibrating arm such that it is recessed from the bottom surface.

In a seventh aspect of the piezoelectric device, the package has an external electrode formed on an outside bottom surface of the package; the electrode pads have a connection electrode to be connected to the external electrode; the piezoelectric vibrating piece has an excitation electrode formed on the vibrating arm for vibrating the vibrating arm and an extraction electrode formed on the supporting arm such that it is extracted from the excitation electrode, the adhesive contain conductive adhesive agent; and the conductive adhesive connects the extraction electrode with the connection electrode electrically.

In a eighth aspect of the piezoelectric device, a column-like convex portion is formed on the bottom surface of the package, the column-like convex portion being disposed between the pair of the electrode pads and extending in the predetermined direction.

In a ninth aspect of the piezoelectric device, the package is formed of ceramic, glass or piezoelectric material.

According to the present invention, because the electrode pads are located asymmetrically with respect to the center line of the turning-fork type piezoelectric vibrating piece, there is no fear that the conductive adhesive applied to the electrode pad may cause a short-circuit even when the conductive adhesive flows away. Additionally, in the piezoelectric device according to the present invention, the turning-fork type piezoelectric vibrating piece can be fixed horizontally.

BRIEF DESCRIPTION OF THE DRAWINGS

FIG. 4 is a flow chart showing manufacturing process of the first piezoelectric device 50.

DETAILED DESCRIPTION

<First Embodiment>

Hereinafter, embodiments of the present invention will be described in details with reference to the accompanying drawings. In following respective embodiments, it is assumed that an extension direction of the vibrating arm is Y-axis direction, a width direction of the vibrating arm is X-axis direction and a direction orthogonal to the X-axis and the Y-axis is Z-axis direction.

(Configuration of First Tuning-Fork Type Quartz Crystal Vibrating Piece 100)

Figure 1A:
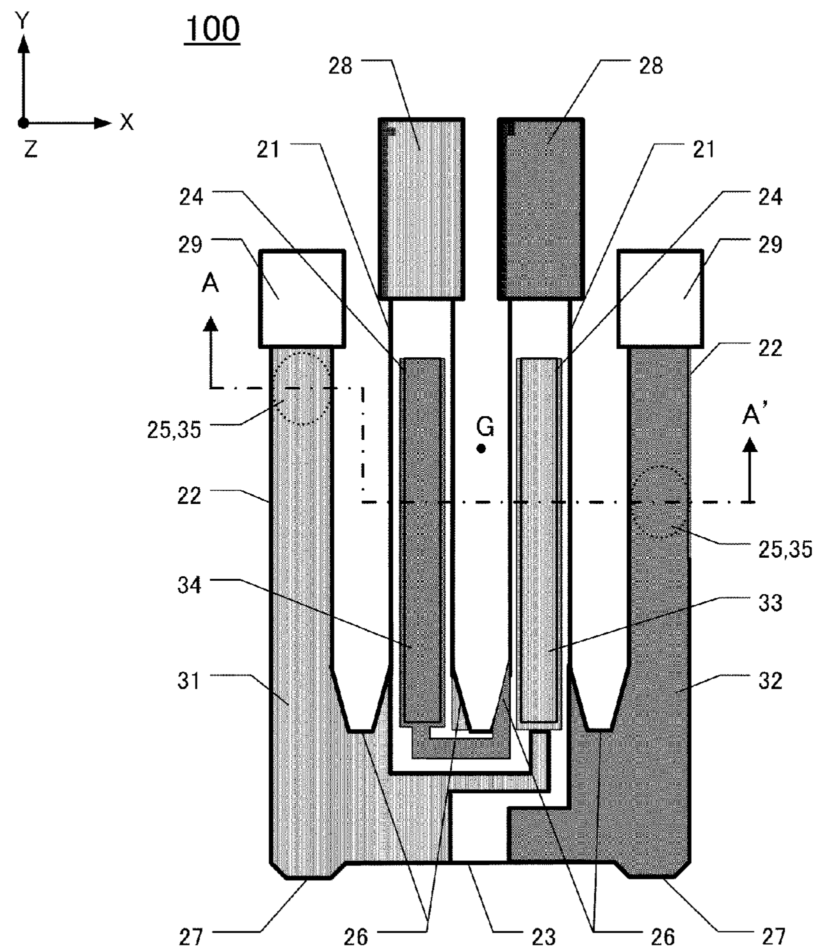
FIG. 1A is a plan view of a first tuning-fork quartz crystal vibrating piece 100.
Figure 1B:
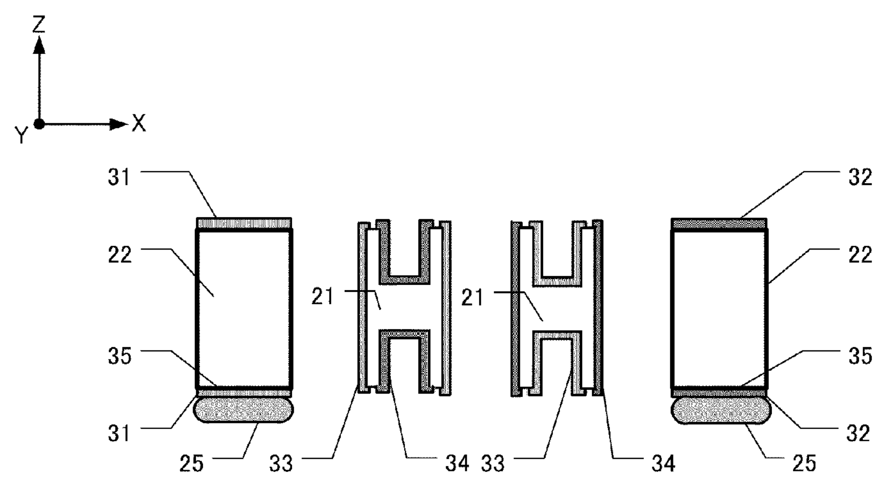
FIG. 1B is a sectional view taken along the line A-A' of FIG. 1A.

FIG. 1A is a plan view of a first tuning-fork quartz crystal vibrating piece 100. The first tuning-fork type quartz crystal vibrating piece 100 is constituted of a base portion 23, vibrating arms 21 extending in the Y-axis direction from the base portion 23 and supporting arms 22 which are located on both sides of the vibrating arms 21 and extended in the Y-axis direction from the base portion 23. FIG. 1B is a sectional view taken along the line A-A' of FIG. 1A.

A pair of the vibrating arms 21 are extended substantially in parallel to each other in the Y-axis direction from the base portion 23 with a specified width (in the X-axis direction). A groove portion 24 is formed in each of front and rear surfaces of the vibrating arms 21 such that it is recessed from the surfaces. For example, a groove portion 24 is formed in the surface of one vibrating arm 21 and a groove portion 24 is also formed in the rear surface of the vibrating arm 21. As shown in FIG. 1B, a section of the groove portion 24 is formed in a substantially H-shape and functions to reduce the CI value of the first tuning-fork type quartz crystal vibrating piece 100. The formation of the groove portion 24 is the same as in following second embodiment.

A vibrating arm wide portion 28 is formed at a distal end of the vibrating arm 21 of the first tuning-fork type quartz crystal vibrating piece 100. The vibrating arm wide portion 28 is formed 5 to 20% wider than the width (in the X-axis direction) of the vibrating arm 21. That is, a portion in the vicinity of the distal end of the vibrating arm 21 is formed wider than other portions in a specified width. The vibrating arm wide portion 28 is provided with metallic film so that the distal end of the vibrating arm 21 is heavy. The vibrating arm wide portion 28 allows the vibrating arm 21 to vibrate easily when a voltage is applied thereto, so that the frequency of the first tuning-fork type quartz crystal vibrating piece 100 can be adjusted easily. Further, in the vibrating arm wide portion 28, the gravity center G (see FIG. 1A) of the entire first tuning-fork quartz crystal vibrating piece 100 is placed close to the vibrating arm wide portion 28, not close to the base portion 23.

The entire base portion 23 of the first tuning-fork type quartz crystal vibrating piece 100 is formed substantially in the shape of a plate. To miniaturize the size of the first tuning-fork type quartz crystal vibrating piece 100, the length of the base portion 23 in the Y-axis direction is preferred to be as small as possible. On the other hand, if the length of the base portion 23 is small, there is a fear that vibration of the vibrating arm 21 may be transmitted outside of the package as vibration leakage so that the tuning-fork type quartz crystal vibrating piece 100 is likely to be affected by changes in temperature outside the package or a shock on the package. Thus, the first embodiment intends to reduce the vibration leakage of the vibrating arm 21 and the influence of changes of the environment outside the package by forming the supporting arms 22 on the first tuning-fork type quartz crystal vibrating piece 100.

As shown in FIG. 1A, the base portion 23 of the first tuning-fork type quartz crystal vibrating piece 100 are extended with a specified width (in the X-axis direction) in the Y-axis direction.

The supporting arms 22 are located on both the outsides of the vibrating arms 21 and extended from the base portion 23 with a specified width (in the X-axis direction) in the Y-axis direction. The supporting arms 22 support the first tuning-fork quartz crystal vibrating piece 100 within a package PKG (see FIG. 2), which will be described later. A supporting arm wide portion 29 is formed at a distal end of the supporting arm 22. The supporting arm wide portion 29 is formed from halfway of the supporting arm 22 such that it is 5 to 20% wider than the width of the supporting arm 22. The length in the Y-axis direction of the supporting arm 22 is smaller than or equal to the length of the vibrating arm 21 in the Y-axis direction. That is, a +Y side end of the supporting arm wide portion is located on a minus side with respect to a +Y side end of the vibrating arm wide portion 28 or on an equal level. The supporting arm wide portion 29 is provided so that the gravity center G (see FIG. 1A) of the entire first tuning-fork type quartz crystal vibrating piece 100 is located close to the supporting arm wide portion 29 but not close to the base portion 23.

A root of the vibrating arm 21 is formed wider. Thus, vibration of the vibrating arm 21 moves stress concentrated on a root toward a root portion 26 to reduce vibration leakage to the base. The root portion 26 constituted of the base portion 23 and a pair of the vibrating arms 21 is shaped in a linear letter-U. Further, other two root portions 26 constituted of the base portion 23, the vibrating arm 21 and the supporting arms 22 are also shaped in the linear letter-U. The three root portions 26 are located at the same position along the Y-axis direction. By forming the three root portions 26 into the same shape, upon wet-etching which is one of manufacturing steps for the first tuning-fork type quartz crystal vibrating piece 100, a pair of the vibrating arms 21 and a pair of the supporting arms 22 are formed in an equal relationship with the base portion 23. Although the root portion 26 is formed in a tapered shape with three straight lines, it may be formed in a smooth U-shape with a curved line.

As shown in FIGS. 1A, 1B, each of the pair of the supporting arms 22 of the first tuning-fork type quartz crystal vibrating piece 10 has a connection portion 35. Conductive adhesive 25 is applied to the pair of the connection portions 35. The pair of the connection portions 35 are shifted with respect to each other in the Y-axis direction. That is, when viewed along the X-axis direction in FIG. 1A, the positions of the pair of the connection portions 35 evidently do not overlap each other. In the meantime, the conductive adhesive 25 is also represented in the same figure.

Next, electrodes formed on the first tuning-fork type quartz crystal vibrating piece 100 will be described. A first excitation electrode 33 and a second excitation electrode 34 are formed in the vibrating arms 21 so that the vibrating arms 21 are vibrated when a voltage is applied. As shown in FIG. 1A, the first excitation electrode 33 and the second excitation electrode 34 are formed in the groove portions 24 and as shown in FIG. 1 B, the first excitation electrode 33 and the second excitation electrode 34 are formed on side faces of the vibrating arms 21 also.

A first base portion electrode 31 and a second base portion electrode 32, which are to be connected electrically with the first excitation electrode 33 and the second excitation electrode 34 respectively, are formed on the supporting arm 22 and the base portion 23. The first base portion electrode 31 and the second base portion electrode 32 to be formed on the supporting arms 22 do not always need to be formed up to the distal end on the +Y side of the supporting arms 22, but only need to be formed up to the connection portions 35 to be coated with the conductive adhesive 25. Alternatively, the first base portion electrode 31 and the second base portion electrode 32 may be formed up to the supporting arm wide portion 29. To bring the gravity center G (see FIG. 1A) of the entire first tuning-fork type quartz crystal piezoelectric vibrating piece 100 close to the supporting arm wide portion 29, the first base portion electrode 31 and the second base portion electrode 32 are preferred to be formed up to the supporting arm wide portion 29.

(Configuration of First Piezoelectric Device)

Figure 2A:
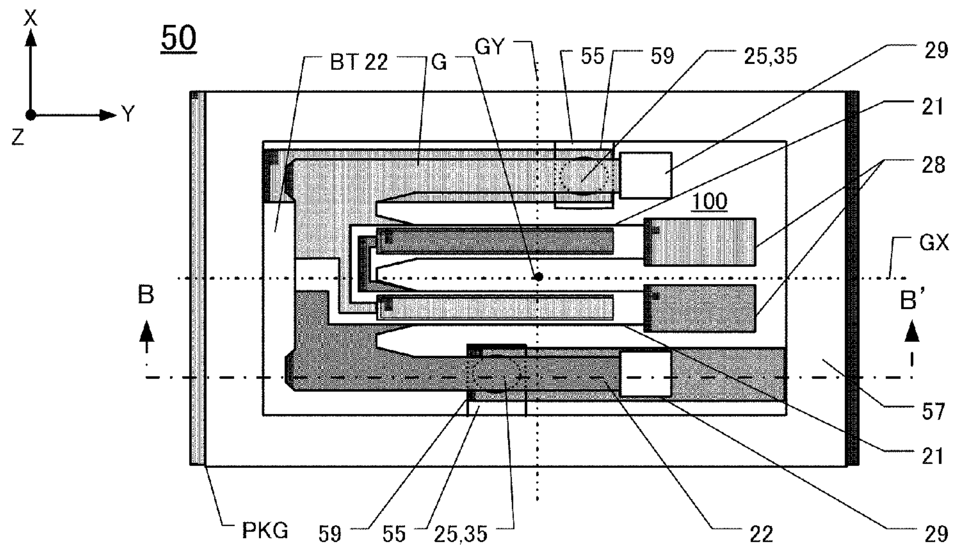
FIG. 2A is a plan view of a first piezoelectric device 50.
Figure 2B:
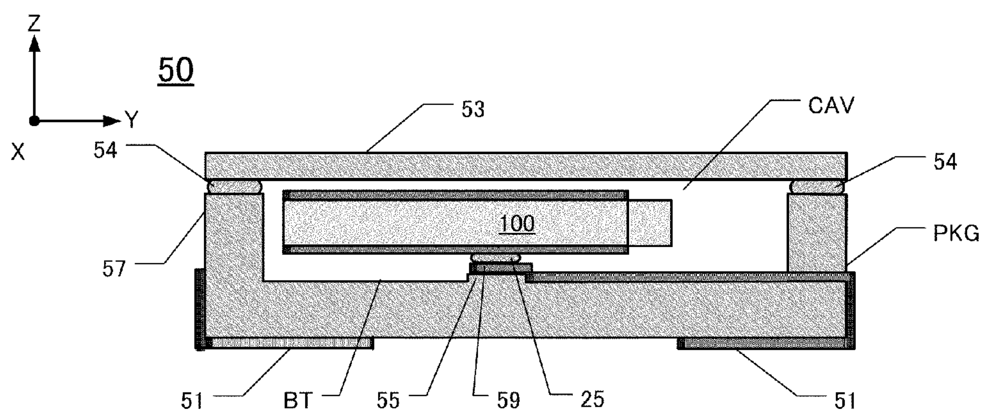
FIG. 2B is a sectional view taken along the line B-B' of FIG. 2A.

FIG. 2A is a plan view of a first piezoelectric device 50 from which a lid body 53 is removed and FIG. 2A is a sectional view taken along the line B-B' of the first piezoelectric device 50. The first piezoelectric device 50 is formed by inserting the first tuning-fork type quartz crystal vibrating piece 100 into a cavity CAV of the package PKG and then joining the lid body 53 to the package PKG with sealing agent 54.

The package PKG is a ceramic package and formed into a shape of a box by stacking a plurality of ceramic sheets. An external electrode 51 is formed on the bottom portion of the package PKG, allowing the package to be mounted on the surface of a printed circuit board (surface mount device: SMD). The external electrode 51 provided on the outside bottom surface of the package PKG can be connected to the printed circuit board (not shown). The external electrode 51 is formed by screen-printing tungsten paste. The package PKG may be formed of glass instead of ceramic.

A pair of electrode pads 55 in the package PKG is provided at positions corresponding to the connection portions 35 of the supporting arms 22. The pair of the electrode pads 55 are shifted with respect to each other in the Y-axis direction, so that when viewed along the X-axis direction in FIG. 2A, the electrode pads 55 evidently do not overlap each other. The electrode pads 55 are formed by stacking ceramic sheets or etching glass. For the reason, the electrode pads 55 are projected in a trapezoidal form from the internal bottom surface of the package PKG. A connection electrode 59 to be connected electrically to the external electrode 51 is formed on the electrode pad 55. The connection electrodes 59 are formed of tungsten paste and as required, the tungsten paste is nickel-plated or plated with gold.

The lid body 53 is constructed of kobar alloy formed by mixing nickel and cobalt with iron or borosilicate glass. In case where the lid body 53 is formed of transparent borosilicate glass, even after the lid body 53 is joined with the sealing agent 54, the frequency of the first turning-fork type quartz crystal vibrating piece 100 can be adjusted by irradiating the vibrating arm wide portions 28 with laser beam to sublimate or evaporate metallic film of the vibrating arm wide portion 28.

Next, a relation between the connection portion 35 of the first tuning-fork type quartz crystal vibrating piece 100 and the conductive pad 55 of the package PKG will be described. The connection portion 35 (first base portion electrode 31 and second base portion electrode 32) and the conductive pad 55 (connection electrode 59) are connected with the conductive adhesive 25. Because in FIG. 3, positions on an X-Y plane of the conductive adhesive 25, the connection portions 35 and the conductive pads 55 are the same, the conductive pads 55 will be described to represent them for explanation of their positions.

The first tuning-fork type quartz crystal vibrating piece 100 is formed so that the gravity center G is located on the +Y side (distal end side) by the vibrating arm wide portions 28 and the supporting arm wide portions 29. The conductive pads 55 are disposed asymmetrically with respect to a line GY passing the gravity center G (parallel to the X-axis) and asymmetrically with respect to a line GX passing the gravity center G (parallel to the Y-axis). That is, one conductive pad 55 is provided on the +Y side (distal end side) with respect to the gravity center G, and the other conductive pad 55 is provided on the −Y side (base portion side) with respect to the gravity center G. Then, one conductive pad 55 and the conductive pad 55 are located on a diagonal line passing the gravity center G of the first tuning-fork type quartz crystal vibrating piece 100.

Because the part of the electrode pads 55 are disposed on the diagonal line passing the gravity center G, when the first tuning-fork type quartz crystal vibrating piece 100 is mounted on the conductive adhesive 25 applied on the electrode pad 55 of the package PKG, the first tuning-fork type quartz crystal vibrating piece 100 is kept horizontal without being tilted until the conductive adhesive 25 is hardened. When the first tuning-fork type quartz crystal vibrating piece 100 is constructed in a small size, even if an excessive amount of the conductive adhesive 25 is applied to the electrode pads 55, there is little fear that a short-circuit may occur between one conductive pad 55 and the other electrode pad 55 because quite a large distance exists between the one conductive pad 55 and the other conductive pad 55.

Further, because the part of the electrode pads 55 are disposed at the same distance from the line GY (parallel to the X-axis) passing the gravity center G, even if the vibrating arm wide portion 28 moves up and down in the Z-axis direction or the base portion 23 moves up and down in the Z-axis direction when the first piezoelectric device 50 receives an impact from outside, the up/down movement of the first piezoelectric device 50 in a vertical direction is smaller than conventional types. Consequently, a possibility that the vibrating arm wide portion 28 or the base portion 23 may collide with the bottom surface BT of the package PKG or the ceiling of the lid body 53 is reduced.

Figures 3A, 3B:
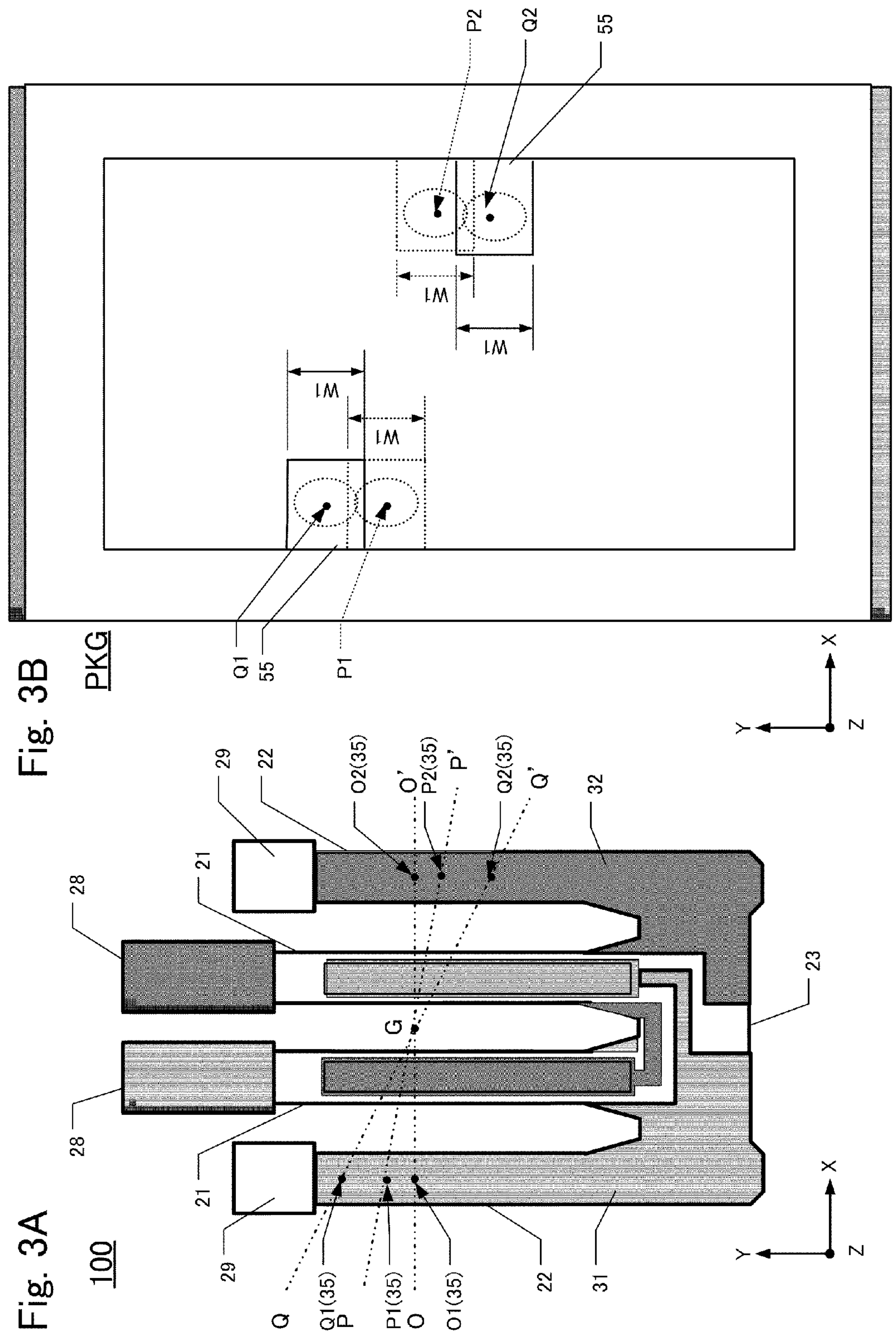
FIG. 3A is an explanatory diagram showing the connection portions 35.
FIG. 3B is an explanatory diagram showing disposing positions of the electrode pads 55.

FIG. 3A is an explanatory diagram showing the connection portions 35 of the first tuning-fork type piezoelectric vibrating piece 100 and FIG. 3B is an explanatory diagram showing disposing positions of the electrode pads 55 of the package PKG. FIG. 3A is a diagram showing disposing positions of the connection portions 35 on a straight line passing the gravity center G of the first tuning-fork type piezoelectric vibrating piece 100. Central points 01, 02 of the connection portions 35 exist on a straight line O-O' passing the gravity center G of the first tuning-fork type piezoelectric vibrating piece 100. When the first tuning-fork type piezoelectric vibrating piece 100 is supported on the central points 01, 02 of the connection portions 35, the first tuning-fork type piezoelectric vibrating piece 100 is held horizontally even if the conductive adhesive 25 has not been hardened. FIG. 3A shows a case where the central points P1, P2 of the connection portions 35 exist on a line P-P' passing the gravity center G of the first tuning-fork type piezoelectric vibrating piece 100 and further another case where the central points Q1, Q2 of the connection portions 35 exist on a line Q-Q' passing the gravity center G of the first tuning-fork type piezoelectric vibrating piece 100.

FIG. 3B is a diagram showing the electrode pads 55 of the package PKG disposed corresponding to the central points P1, P2 of the connection portions 35 and the central points Q1, Q2 of the connection portion 35. A width in the Y-axis direction of the electrode pad 55 is W1. If viewed from the X-axis direction, the widths W1 in the Y-axis direction of the electrode pads 55 corresponding to the central points P1, P2 of the connection portion 35 overlap each other partly but not completely. The widths W1 in the Y-axis direction of the electrode pads 55 corresponding to the central points Q1, Q2 of the connection portion 35 do not overlap each other even partly.

With a miniaturization of the piezoelectric device 50, the distance between the central points 01 and 02 of the connection portions 35 on the straight line 0-0' corresponding to the electrode pads 55 is reduced. In a process for applying the conductive adhesive 25 to the electrode pads 55, applying the conductive paste 25 taking care that conductive adhesive 25 applied to one electrode pad 55 does not make contact with the conductive adhesive 25 on the other electrode pad 55 is not an easy work.

According to the first embodiment, the pair of the electrode pads 55 are shifted relative to each other in the Y-axis direction to prevent the conductive adhesive 25 applied to one electrode pad 55 from causing a short-circuit with the conductive adhesive 25 applied to the other electrode pad 55 when the conductive adhesive flows away to the other side. To intensify the resistance to impact of the piezoelectric device 50, the pair of the electrode pads 55 are disposed at the same distance from the line GY passing the gravity center G. That is, the electrode pads 55 are disposed on the central points P1, P2 of the connection portions 35 located on the line P-P' passing the gravity center G of the first tuning-fork type piezoelectric vibrating piece 100 or on the central points Q1, Q2 of the connection portion 35, so that the distance between the electrode pads 55 is increased to prevent a short-circuit.

(Manufacturing Method of First Piezoelectric Device)

FIG. 4 is a flow chart showing manufacturing process of the first piezoelectric device 50.

In step S102, the lid body 53 formed of transparent glass or metal plate of, for example, kovar is prepared.

The first tuning-fork type quartz crystal vibrating piece 100 is formed through step S112 to step S116. In step S112, the first tuning-fork type quartz crystal vibrating piece 100 with the supporting arms is formed in a quartz crystal wafer VW. The external shape of the first tuning-fork type quartz crystal vibrating piece 100 and the groove portions 24 are formed by means of known photolithography etching technology.

A plurality of the first tuning-fork type quartz crystal vibrating pieces 100 are produced by etching a round or square quartz crystal wafer at the same time. Using a mask of corrosion resistant film (not shown), the first tuning-fork type quartz crystal vibrating piece 100 is formed by etching the quartz crystal wafer exposed through the mask with, for example, hydrofluoric acid fluid as an etching fluid. As the corrosion resistant film, it is permissible to use, for example, metallic film formed by depositing gold on a foundation of chrome. The groove portions 24 are formed in the vibrating arms 22 at the same time.

In step S114, as shown in FIG. 1A, the first base portion electrode 31, the second base portion electrode 32 and the first excitation electrode 33 and the second excitation electrode 34 are formed on the first tuning-fork type quartz crystal vibrating piece 100. These electrodes are formed with a two-layer structure in which Au film is provided on the foundation of Ni film. Upon formation of the electrodes, the entire surface of a quartz crystal wafer is coated with the metal which is to serve as electrodes by deposition or sputtering and then, the electrodes are formed by photolithography by using a resist which exposes a portion in which no electrode is to be formed. The metallic film is formed on the vibrating arm wide portions 28 also. Further, the metallic film may be formed on the supporting arm wide portions 29 also.

In step S116, the first tuning-fork type quartz crystal vibrating piece 100 is cut out from the quartz crystal wafer VW. Because the first tuning-fork type quartz crystal vibrating piece 100 has a connection with the quartz crystal wafer VW via connection end portions 27 (see FIG. 1) of the base portion 23, it is separated from the quartz crystal wafer VW by cutting the connection end portions 27.

The package PKG is formed through step S122 to step S126. In step S122, ceramic sheets consisting of a base sheet, a bottom plate sheet in which the electrode pads 55 are formed, and a cavity sheet having a frame-shaped edge portion are prepared. Tungsten paste is applied onto the bottom plate sheet by screen-printing method to form the connection electrodes 59. Further, tungsten paste is applied onto the base sheet by screen-printing method to form the external electrode 51.

In step S124, the base sheet, the bottom plate sheet and the cavity sheet are stacked. The stacked three ceramic sheets are cut into individual packages PKG.

In step S126, the cut packages PKG are burnt at about 1320 degrees (Celsius). As a result, the package PKG is completed.

In step S152, the conductive adhesive is applied to the pair of the electrode pads 55 on the package PKG. Because the pair of the electrode pads 55 are far from each other, a possibility that the applied conductive adhesive 25 may cause a short-circuit is low. A quartz crystal vibrating piece mounting apparatus (not shown) absorbs the first tuning-fork type quartz crystal vibrating piece 100 by vacuum and carries it into the package PKG. Then, the first tuning-fork type quartz crystal vibrating piece 100 is mounted on the electrode pads 55 of the package PKG provided at positions corresponding to the connection portions 35 of the supporting arms 22. Transportation and positioning of the first tuning-fork type quartz crystal vibrating piece 100 by means of the quartz crystal vibrating piece mounting apparatus are carried out by image processing technology using a CCD camera (not shown). Specifically, the CCD camera recognizes positions of the connection electrodes 59 in the package PKG to define the position of the first tuning-fork type quartz crystal vibrating piece 100 with respect to the package PKG.

Next, after the conductive adhesive 25 is hardened preliminarily, the conductive adhesive 25 is hardened finally within a hardening furnace. It takes a time until the conductive adhesive 25 is hardened finally after the first tuning-fork type quartz crystal vibrating piece 100 is mounted on the conductive adhesive 25. However, because the pair of the electrode pads 55 are disposed on a diagonal line connecting the gravity centers G of the first tuning-fork type quartz crystal vibrating piece 100, the first turning-fork type quartz crystal vibrating piece 100 is never tilted from a horizontal condition.

In step S154, the sealing agent 54 is applied to the top portion of a frame portion 57 of the package PKG. The lid body 53 is mounted on the package PKG. After the lid body 53 is mounted on the package PKG, it is heated at about 350 degrees (Celsius) in vacuum or inert gas environment and pressed to be bonded to the package PKG. After that, the drive performance of the first piezoelectric device 50 is inspected and after that, the first piezoelectric device 50 is finished.

<Second Embodiment>

Figure 5A:
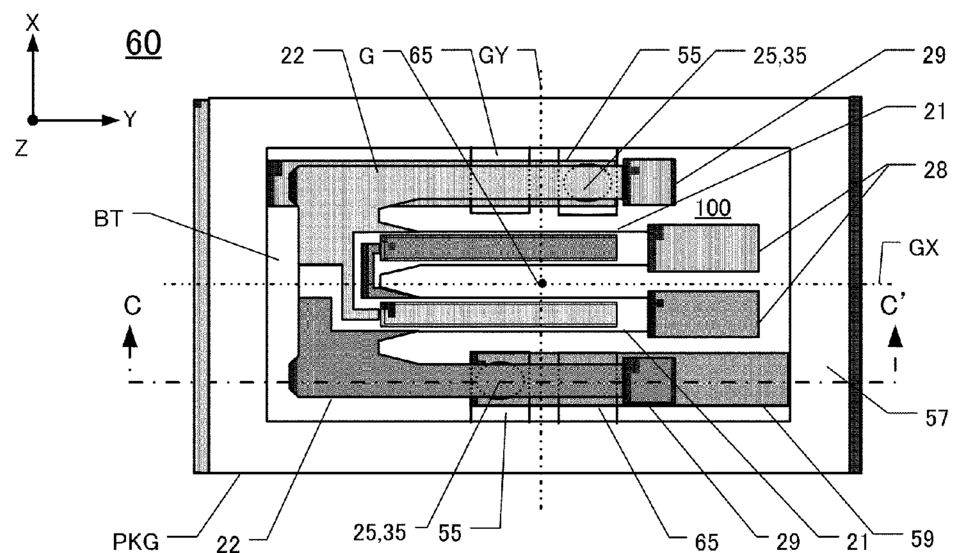
FIG. 5A is a plan view of a second piezoelectric device 60.
Figure 5B:
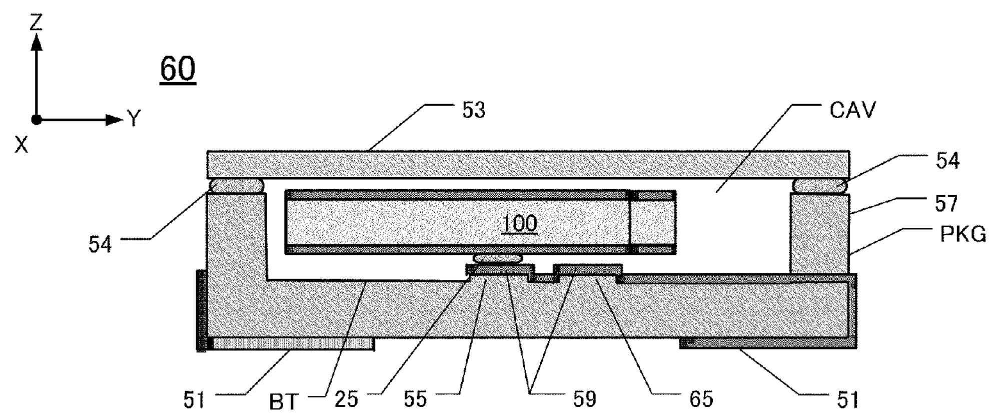
FIG. 5B is a sectional view taken along the line C-C' of the second piezoelectric device 60 shown in FIG. 5A

FIG. 5A is a plan view of a second piezoelectric device 60 from which the lid body 53 is removed and FIG. 5B is a sectional view taken along the line C-C' of the second piezoelectric device 60 shown in FIG. 5A. The second piezoelectric device 60 has four electrode pads which are provided on the bottom surface BT of the package PKG and is different from the first piezoelectric device 50 in that the number of the electrode pads is larger than that of the first piezoelectric device 50. The electrode pad of the second piezoelectric device 60 is constituted of electrode pads 55 and electrode pads 65. Hereinafter, different portions from the first piezoelectric device 50 will be described.

As shown in FIG. 5A, the conductive pads 55 are disposed asymmetrically with respect to a line GY passing the gravity center G and asymmetrically with respect to a line GX (parallel to the Y-axis) passing the gravity center G. The electrode pads 65 are disposed asymmetrically with respect to the line GY passing the gravity center G and asymmetrically with respect to the line GX passing the gravity center G. The diagonal line connecting the pair of the electrode pads 55 is disposed symmetrically with a diagonal line connecting the pair of the electrode pads 65 with respect to the line GY. A connection electrode 59 is formed on the electrode pad 65. No conductive adhesive 25 is applied to the electrode pad 65, so that the electrode pads 65 are not joined with the supporting arms 22 of the first turning-fork type quartz crystal vibrating piece 100.

With such a configuration, if an electronic device receives a shock when it falls on the ground, the electrode pads 65 act as buffering portions to relax an impact caused when the distal ends of the vibrating arms make contact with the bottom surface BT. The pair of the electrode pads 65 may be coated with the conductive adhesive 25 so that they may be joined to the supporting arms 22 of the first tuning-fork type quartz crystal vibrating piece 100, while the pair of the electrode pads 55 are not coated with the conductive adhesive 25.

<Third Embodiment>

Figure 6A:
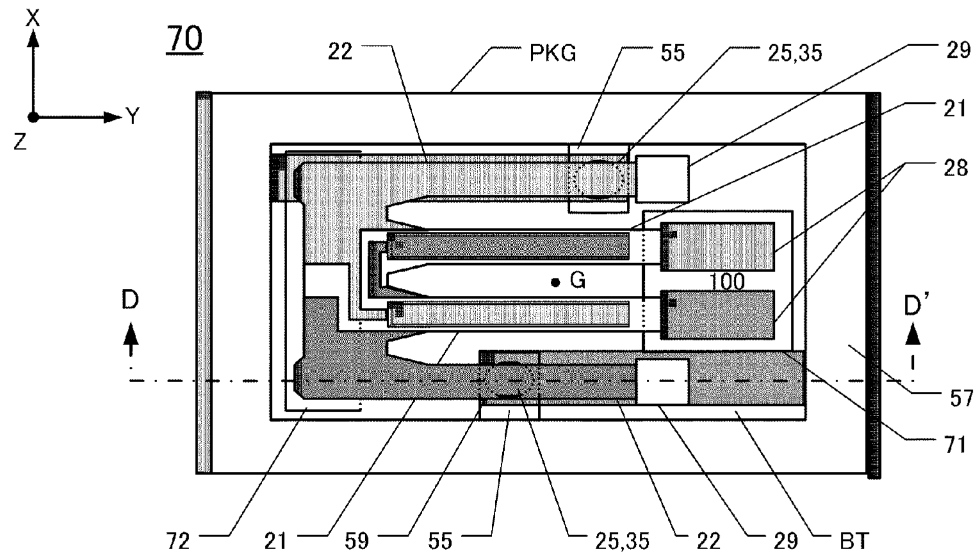
FIG. 6A is a plan view of a third piezoelectric device 70 from which the lid body 53 is removed and FIG. 6B is a sectional view taken along the line D-D' of the third piezoelectric device 70 shown in FIG. 6A.
Figure 6B:
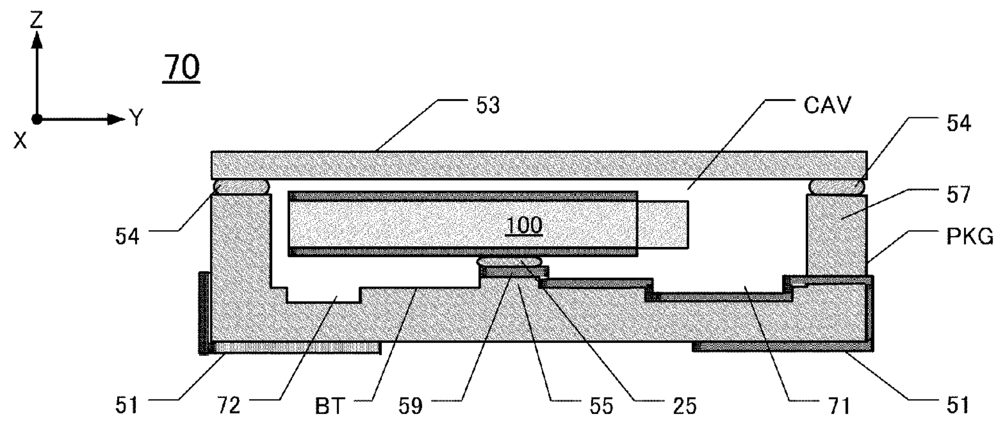

FIG. 6A is a plan view of a third piezoelectric device 70 from which the lid body 53 is removed and FIG. 6B is a sectional view taken along the line D-D' of the third piezoelectric device 70 shown in FIG. 6A. The third piezoelectric device 70 is different from the first piezoelectric device 50 in that a first recess portion 71 and a second recess portion 72 are provided in the bottom surface BT of the package PKG. Hereinafter, portions different from the first piezoelectric device 50 will be described.

As shown in FIGS. 6A, 6B, the first recess portion 71 is formed in a bottom surface BT of the package PKG corresponding to the distal end of the vibrating arm 21 such that it is recessed downward, and the second recess portion 72 is formed in a bottom surface corresponding to the base portion 23 such that it is recessed downward. With such a configuration, even if the distal end of the vibrating arm 21 swings largely when an electronic device receives an impact due to a fall on the ground, a contact of the distal end with the bottom surface BT can be prevented by the first recess portion 71 recessed from the bottom surface BT. Even if an end portion of the base portion 23 swings largely, a contact of the end portion of the base portion 23 with the bottom surface BT can be prevented by the second recess portion 72 recessed from the bottom surface BT.

When mounting the first tuning-fork type quartz crystal vibrating piece 100 on the conductive adhesive 25 applied to the electrode pads 55 of the package PKG by using a quartz crystal vibrating piece mounting apparatus (not shown), the first tuning-fork type quartz crystal vibrating piece 100 is held horizontally without being tilted until the conductive adhesive 25 is hardened. The pair of the electrode pads 55 are disposed on a diagonal line passing the gravity center G. Even if the first tuning-fork type quartz crystal vibrating piece 100 is absorbed obliquely by the quartz crystal vibrating piece mounting apparatus (not shown), the first tuning-fork type quartz crystal vibrating piece 100 can be mounted accurately while the distal end of the first tuning-fork type quartz crystal vibrating piece 100 or the end of the base portion 23 makes no contact with the bottom surface BT of the cavity CAV.

(Configuration of Second Tuning-Fork Type Quartz Crystal Vibrating Piece 110)

Figure 7A:
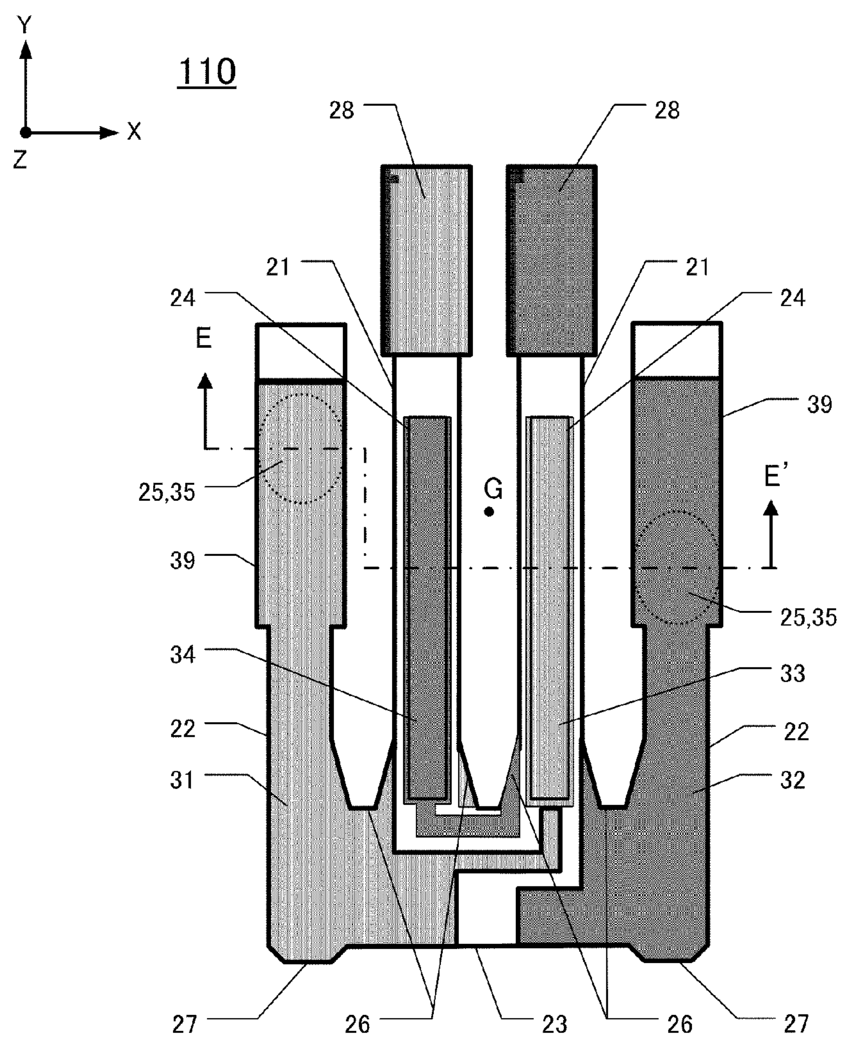
FIG. 7A is a plan view of the second tuning-fork type piezoelectric vibrating piece 110 and FIG. 7B is a sectional view taken along the line E-E' of the second tuning-fork type piezoelectric vibrating piece 110 shown in FIG. 7A.
Figure 7B:
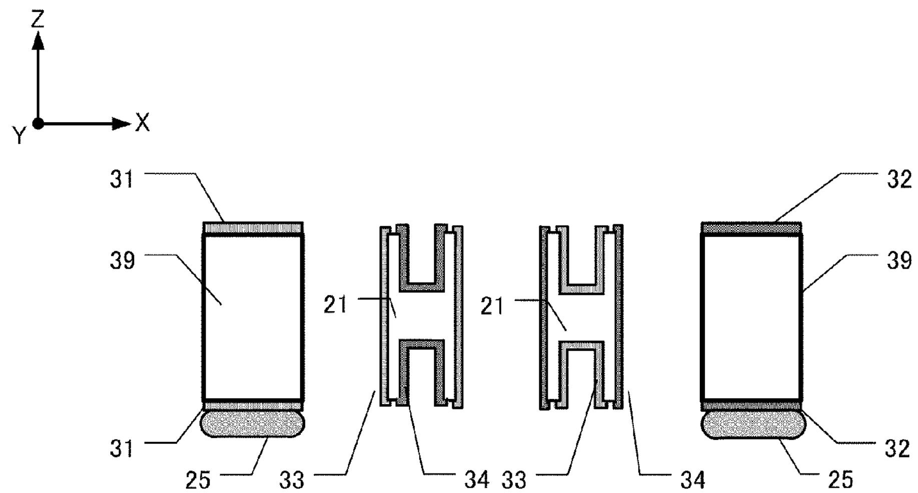

FIG. 7A is a plan view of the second tuning-fork type piezoelectric vibrating piece 110 and FIG. 7B is a sectional view taken along the line E-E' of the second tuning-fork type piezoelectric vibrating piece 110 shown in FIG. 7A. The second tuning-fork type piezoelectric vibrating piece 110 is different from the first tuning-fork type piezoelectric vibrating piece 100 in that its supporting arms 22 are provided with a wide attachment portion area 39. Hereinafter, different portions from the first tuning-fork type piezoelectric vibrating piece 100 will be described.

As shown in FIG. 7A, the second tuning-fork type quartz crystal vibrating piece 110 is provided with a pair of tuning-fork type vibrating arms 21 and wide attachment portion areas 39 at its base portion 23. In the wide attachment portion area 39, a portion on the distal end side from about half (substantially in the vicinity of the central portion) of the length of the supporting arm 22 is formed in a specified width larger than the width (X-axis direction) of the supporting arm 22.

A wide connection portion 35 is formed on the attachment portion area 39. One wide connection portion 35 is disposed on a distal end side of the supporting arm 22 with respect to the gravity center G of the second tuning-fork type quartz crystal vibrating piece 110, while the other wide connection portion 35 is disposed on a root side of the supporting arm 22 with respect to the gravity center G, and both the connection portions 35 are located on a diagonal line running across the gravity center G. The gravity center G is determined by a vibrating arm wide portion 28 and the attachment portion area 39 of the supporting arm 22 such that the gravity center G is not located in the vicinity of the base portion 23. When the second tuning-type quartz crystal vibrating piece 110 is mounted on the conductive adhesive 25 applied to electrode pads 55 of a package PKG, the second tuning-fork type quartz crystal vibrating piece 110 is held horizontally without being tilted until the conductive adhesive 25 is hardened.

As shown in FIGS. 7A, 7B, the second tuning-fork type quartz crystal vibrating piece 110 is provided with the connection portions 35 wider than the first embodiment at the pair of the supporting arms 22. The wide connection portions 35 allow an appropriate amount of the conductive adhesive 25 to be applied thereto, ensuring a considerably high bonding strength to raise the resistance to impact. When the second tuning-fork type quartz crystal vibrating piece receives an impact due to a fall of an electronic device on the ground, an impact on the vibrating arm 21 when a distal end of the vibrating arm 21 collides with the bottom surface of the package is relaxed.

<Fourth Embodiment>

Figure 8A:
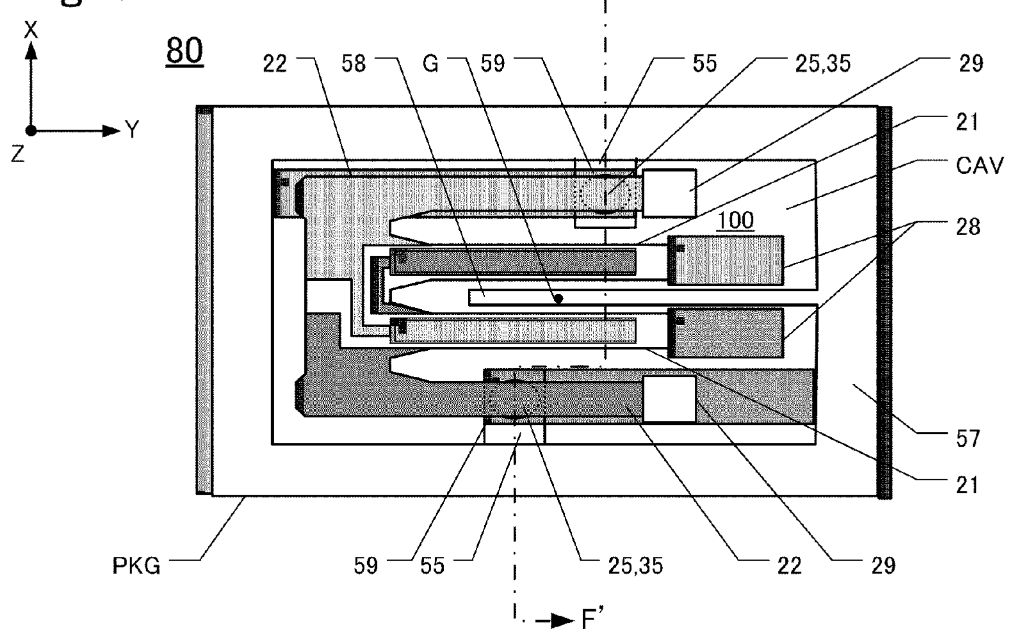
FIG. 8A is a plan view of a fourth piezoelectric device 80 and FIG. 8B is a sectional view taken along the line F-F' of the fourth piezoelectric device 80 shown in FIG. 8A.
Figure 8B:
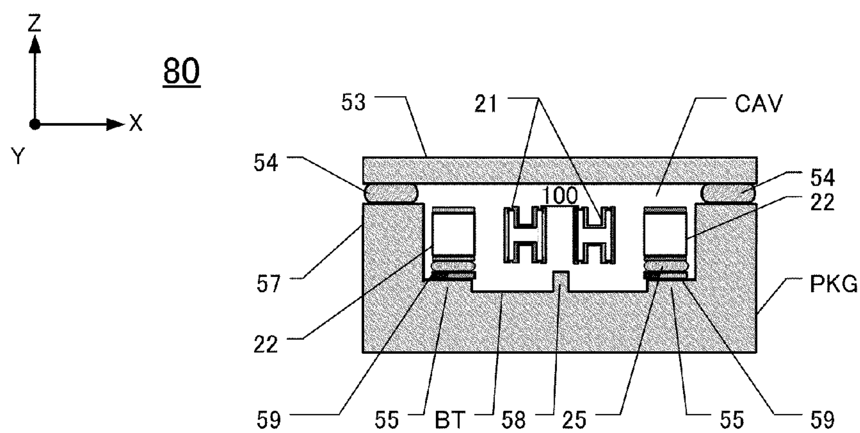

FIG. 8A is a plan view of a fourth piezoelectric device 80 and FIG. 8B is a sectional view taken along the line F-F' of the fourth piezoelectric device 80 shown in FIG. 8A. The fourth piezoelectric device 80 is different from the first piezoelectric device 50 in that a column-like convex portion 58 is provided on the bottom surface BT of the package PKG.

In the fourth piezoelectric device 80, the first tuning-fork type quartz crystal vibrating piece 100 is inserted in a cavity CAV of the package PKG, and a lid body 53 and the package PKG are joined together in a vacuum condition using sealing agent 54. Because the lid body 53 is formed of borosilicate glass, the frequency can be adjusted even after the piezoelectric device is sealed off.

As shown in FIGS. 8A, 8B, a pair of electrode pads 55 are disposed on the bottom surface BT of the cavity CAV. The column-like convex portion 58 is formed on the bottom surface BT between the pair of the electrode pads 55 such that the convex portion 58 is projected from the bottom surface BT extending in the Y-axis direction. The column-like convex portion 58 is formed together with ceramic sheet which forms the electrode pads 55. A front end of the column-like convex portion 58 extends beyond the gravity center G of the first tuning-fork type quartz crystal vibrating piece 100.

The connection portions 35 of the supporting arms 22 of the first tuning-fork type quartz crystal vibrating piece 100 are mounted on the electrode pads 55 of the package PKG via the conductive adhesive 25. If an excessive amount of the conductive adhesive 25 is applied to the pair of the electrode pads 55, there is a fear that the conductive adhesive 25 may flow away to cause a short-circuit before the conductive adhesive 25 is hardened. By providing the column-like convex portion 58, even if a large amount of the conductive adhesive 25 is applied and the conductive adhesive flows away, the conductive adhesive is blocked by the column-like convex portion 58 thereby eliminating a fear of the short-circuit. Further, the fourth piezoelectric device 80 allows the second tuning-fork type piezoelectric vibrating piece 110 to be mounted in the package PKG instead of the first tuning-fork type quartz crystal vibrating piece 100.

[Technical Applicability]

The preferred embodiments of the present invention have been described in detail. As evident to those skilled in the art, the present invention can be carried out by changing or modifying the embodiments in various ways within a technical scope of the invention. For example, although ceramic material is used for formation of the package of this embodiment, the package may be formed of glass or other material. Although the tuning-fork type quartz crystal vibrating piece is employed in this embodiment, it is permissible to use other piezoelectric material such as lithium tantalite and lithium niobate, as well as quartz crystal. Additionally, the piezoelectric device of the present invention is applicable to a piezoelectric oscillator in whose package an IC incorporating an oscillating circuit is built.

What is claimed is:

1. A piezoelectric device comprising:

a piezoelectric vibrating piece having a base portion, a pair of vibrating arms extending in a specified direction from the base portion, a pair of supporting arms extending from the base portion, and only one pair of connection portions disposed on the pair of the supporting arms;

a package having a bottom surface which accommodates the piezoelectric vibrating piece and side faces surrounding the bottom surface, in which a pair of electrode pads corresponding to the connection portions are formed on the bottom surface; and adhesive for bonding the pair of the electrode pads with the pair of connection portions, wherein one electrode pad and the other electrode pad, with adhesive applied to the electrode pads, are shifted with respect to each other in a predetermined direction and a connection between said piezoelectric vibrating piece and said package consists essentially of said adhesive bonding said pair of electrode pads with said one pair of connection portions.

2. The piezoelectric device according to claim 1, wherein the pair of the electrode pads are formed in the form of a pedestal having a width in the predetermined direction and one electrode pad and the other electrode pad, with adhesive applied to the electrode pads, are located such that the electrode pads do not overlap each other when viewed from the horizontal direction perpendicular to the predetermined direction.

3. The piezoelectric device according to claim 1, wherein the connection portions are disposed on a straight line passing a gravity center of the piezoelectric vibrating piece.

4. The piezoelectric device according to claim 2, wherein the connection portions are disposed on a straight line passing a gravity center of the piezoelectric vibrating piece.

5. The piezoelectric device according to claim 1, wherein the connection portion is disposed at any point of the length of the supporting arm in the predetermined direction.

6. The piezoelectric device according to claim 2, wherein the connection portion is disposed at any point of the length of the supporting arm in the predetermined direction.

7. The piezoelectric device according to claim 3, wherein the connection portion is disposed at any point of the length of the supporting arm in the predetermined direction.

8. The piezoelectric device according to claim 1, wherein the pair of the electrode pads serve as positioning marks for locating the piezoelectric vibrating piece within the package and by detecting the positioning marks, the piezoelectric vibrating piece is mounted within the package.

9. The piezoelectric device according to claim 1, wherein
a first recess portion is formed in the bottom surface corresponding to a distal end of the vibrating arm in the predetermined direction such that it is recessed from the bottom surface, and
a second recess portion is formed in the bottom surface corresponding to the base portion located on an opposite side to the distal end of the vibrating arm such that it is recessed from the bottom surface.

10. The piezoelectric device according to claim 2, wherein
a first recess portion is formed in the bottom surface corresponding to a distal end of the vibrating arm in the predetermined direction such that it is recessed from the bottom surface, and
a second recess portion is formed in the bottom surface corresponding to the base portion located on an opposite side to the distal end of the vibrating arm such that it is recessed from the bottom surface.

11. The piezoelectric device according to claim 3, wherein
a first recess portion is formed in the bottom surface corresponding to a distal end of the vibrating arm in the predetermined direction such that it is recessed from the bottom surface, and
a second recess portion is formed in the bottom surface corresponding to the base portion located on an opposite side to the distal end of the vibrating arm such that it is recessed from the bottom surface.

12. The piezoelectric device according to claim 1, wherein
the package has an external electrode formed on an outside bottom surface of the package;
the electrode pads have a connection electrode to be connected to the external electrode;
the piezoelectric vibrating piece has an excitation electrode formed on the vibrating arm for vibrating the vibrating arm and an extraction electrode formed on the supporting arm such that it is extracted from the excitation electrode,
the adhesive contain conductive adhesive agent; and
the conductive adhesive connects the extraction electrode with the connection electrode electrically.

13. The piezoelectric device according to claim 2, wherein
the package has an external electrode formed on an outside bottom surface of the package;
the electrode pads have a connection electrode to be connected to the external electrode;
the piezoelectric vibrating piece has an excitation electrode formed on the vibrating arm for vibrating the vibrating arm and an extraction electrode formed on the supporting arm such that it is extracted from the excitation electrode,
the adhesive contain conductive adhesive agent; and
the conductive adhesive connects the extraction electrode with the connection electrode electrically.

14. The piezoelectric device according to claim 3, wherein
the package has an external electrode formed on an outside bottom surface of the package;
the electrode pads have a connection electrode to be connected to the external electrode;
the piezoelectric vibrating piece has an excitation electrode formed on the vibrating arm for vibrating the vibrating arm and an extraction electrode formed on the supporting arm such that it is extracted from the excitation electrode,
the adhesive contain conductive adhesive agent; and
the conductive adhesive connects the extraction electrode with the connection electrode electrically.

15. The piezoelectric device according to claim 1, wherein a column-like convex portion is formed on the bottom surface of the package, the column-like convex portion being disposed between the pair of the electrode pads and extending in the predetermined direction.

16. The piezoelectric device according to claim 2, wherein a column-like convex portion is formed on the bottom surface of the package, the column-like convex portion being disposed between the pair of the electrode pads and extending in the predetermined direction.

17. The piezoelectric device according to claim 3, wherein a column-like convex portion is formed on the bottom surface of the package, the column-like convex portion being disposed between the pair of the electrode pads and extending in the predetermined direction.

18. The piezoelectric device according to claim 1, wherein the package is formed of ceramic, glass or piezoelectric material.

19. The piezoelectric device according to claim 3, wherein the package is formed of ceramic, glass or piezoelectric material.

20. A piezoelectric device having a longitudinal axis and a lateral axis perpendicular to said longitudinal axis, said piezoelectric device comprising:
a piezoelectric vibrating piece having center of gravity, a base portion, a pair of vibrating arms extending from the base portion generally parallel with said longitudinal axis, a pair of supporting arms extending from the base portion, and only one pair of connection portions disposed on the pair of the supporting arms;
a concave package having a bottom surface which accommodates the piezoelectric vibrating piece and side faces surrounding the bottom surface, in which a pair of electrode pads corresponding to the connection portions are formed on the bottom surface; and
conductive adhesive for bonding the pair of the electrode pads with the pair of connection portions,
wherein said pair of electrode pads and one pair of connection portions are disposed asymmetrically with respect to both a line passing through said center of gravity and parallel with said longitudinal axis and a line passing through said center of gravity and parallel to said lateral axis and an electrical and mechanical connection between said piezoelectric vibrating piece and said package consists essentially of said adhesive bonding said pair of electrode pads with said one pair of connection portions.

* * * * *